(12) United States Patent
Sutter (10) Patent No.: US 12,214,897 B2
(45) Date of Patent: Feb. 4, 2025

(54) ESCAPE ROUTE MARKING IN VEHICLES

(71) Applicant: Lufthansa Technik AG, Hamburg (DE)

(72) Inventor: Wolfgang Sutter, Halstenbek (DE)

(73) Assignee: LUFTHANSA TECHNIK AG, Hamburg (DE)

( * ) Notice: Subject to any disclaimer, the term of this patent is extended or adjusted under 35 U.S.C. 154(b) by 0 days.

(21) Appl. No.: 18/041,696

(22) PCT Filed: Aug. 17, 2021

(86) PCT No.: PCT/EP2021/072775
§ 371 (c)(1),
(2) Date: Feb. 15, 2023

(87) PCT Pub. No.: WO2022/038107
PCT Pub. Date: Feb. 24, 2022

(65) Prior Publication Data
US 2023/0312130 A1 Oct. 5, 2023

(30) Foreign Application Priority Data
Aug. 17, 2020 (DE) ...................... 10 2020 121 515.0

(51) Int. Cl.
*B64D 45/00* (2006.01)
*B60Q 3/47* (2017.01)
*B60Q 3/74* (2017.01)

(52) U.S. Cl.
CPC ............... *B64D 45/00* (2013.01); *B60Q 3/47* (2017.02); *B60Q 3/745* (2017.02); *B64D 2045/007* (2013.01)

(58) Field of Classification Search
CPC .... B64D 45/00; B64D 2045/007; B60Q 3/47; B60Q 3/745
See application file for complete search history.

(56) References Cited

U.S. PATENT DOCUMENTS 8,450,926 B2   5/2013  Roberts et al.
2003/0189823 A1 10/2003 George et al.
(Continued)

FOREIGN PATENT DOCUMENTS

DE   102005042627 A1   3/2007
DE   102006060781   *   4/2008
(Continued)

OTHER PUBLICATIONS

Lighttape UK, History of Electroluminescence, May 24, 2019, pp. 1-4, Minnesota, USA, https://web.archive.org/web/20190524151017/http://www.lighttape.co.uk:80/info/history-of-el/.
(Continued)

*Primary Examiner* — Justin M Benedik
(74) *Attorney, Agent, or Firm* — LEYDIG, VOIT & MAYER, LTD.

(57) ABSTRACT

An illumination element marks escape routes in vehicles. The illumination element includes a planar substrate, which has: a base surface configured for fastening on a first side; and at least one planar electrical lighting element on a second side. A ratio of a surface area of the base surface to a thickness of the illumination element is greater than 500 mm, and a ratio of the surface area of the base surface to a mass of the illumination element is greater than 100 mm²/g.

15 Claims, 5 Drawing Sheets

(56) References Cited

U.S. PATENT DOCUMENTS

| | | |
|---|---|---|
| 2008/0202912 A1 | 8/2008 | Boddie et al. |
| 2009/0290332 A1 | 11/2009 | Jacobs et al. |
| 2010/0033980 A1 | 2/2010 | Vogel et al. |
| 2012/0326521 A1 | 12/2012 | Bauer et al. |
| 2019/0080655 A1 | 3/2019 | Mueller-Diveky |

FOREIGN PATENT DOCUMENTS

| | | |
|---|---|---|
| DE | 102006060781 A1 | 4/2008 |
| DE | 102008036470 A1 | 2/2010 |
| DE | 102017008465 A1 | 3/2019 |
| EP | 2857315 A1 | 4/2015 |
| EP | 3575201 A1 | 12/2019 |
| KR | 20110083312 A | 7/2011 |
| KR | 102005665 B1 | 7/2019 |
| WO | WO 2017172943 A1 | 10/2017 |

OTHER PUBLICATIONS

Leslie L. Eaton, et al., Improved Emergency Egress Lighting System for the ISS, NASA Tech Brief, Dec. 1, 2005, p. 31, https://ntrs.nasa.gov/citations/20110016463.

Anonymous, Electroluminescent Helicopter Emergency Egress Lighting (HEEL) System, System Maintenance and Installation Manual, Jul. 31, 2003, pp. 1-49, Luminescent Systems, Inc., Lebanon, NH, USA.

Adafruit product Electroluminescent (EL) Panel, Apr. 26, 2017, https://www.amazon.co.uk/Adafruit-Electroluminescent-EL-Panel-ADA625/dp/B01BKAOPDK/.

Adafruit, White Electroluminescent (EL) Tape Strip, Jul. 23, 2015, pp. 1-5.

EL Panel and Tape electroluminescent tape, Sep. 23, 2017, https://web.archive.org/web/20170923103326/http:/elpanelandtape.co.uk/el-tape/.

Innr Flex Light Colour, Jun. 2020, pp. 1-17, https://www.innr.com/en/product/flex-strip-colour-2m-or-4m/, https://hueblog.com/2020/07/21/innr-flex-light-first-impressions-of-the-new-light-strip/.

Philips Lightstrip plus extension LED lightstrip-product brochure, Aug. 10, 2020, pp. 1-3.

\* cited by examiner

ESCAPE ROUTE MARKING IN VEHICLES

CROSS REFERENCE TO RELATED APPLICATIONS

This application is a U.S. National Phase application under 35 U.S.C. § 371 of International Application No. PCT/EP2021/072775, filed on Aug. 17, 2021, and claims benefit to German Patent Application No. DE 10 2020 121 515.0, filed on Aug. 17, 2020. The International Application was published in German on Feb. 24, 2022 as WO 2022/038107 A1 under PCT Article 21(2).

FIELD

The present disclosure relates to an illumination element for marking escape routes in vehicles, in particular in commercial aircraft, and its use as an escape route marking and an arrangement comprising at least one corresponding illumination element.

BACKGROUND

Two variants for mandatory escape route markings are fundamentally known in commercial aircraft, such marking being used in order to indicate the path to the emergency exits to passengers in an emergency in the event of darkness and failure of the general cabin lighting.

Known electrical systems comprise lighting units having one or more light sources disposed in a housing for protection from external influences, such as incandescent bulbs or LEDs, which are connected by electrical wiring to the onboard electrical system of the aircraft and can be operated via this. In addition, buffer batteries also have to be provided, which can ensure the operation of the lighting units even in the event of failure of the onboard electrical system. Corresponding systems generally have a significant mass and in particular the wiring has proven to be susceptible to malfunction.

Due to the required wiring—but also because suitable receptacles in the accommodating structure (for example the floor) generally have to be provided for the housing of the lighting units—electrical systems can barely (or not at all) be reconfigured. If the cabin layout of an aircraft is to be changed, therefore, either the options for the changes are restricted to not requiring any changes on the escape route marking, or a complex and extremely costly reinstallation of an escape route marking is required.

Photoluminescent systems are also known, in which the escape route marking has photoluminescent surfaces, which are charged in normal operation by the ambient or cabin light and continue to illuminate even over a comparatively long period of time in darkness—for example in the event of an emergency—and thus indicate the escape routes. The photoluminescent escape route marking, which is generally available in the form of strips, may typically be fastened with little effort in the aircraft cabin of an aircraft, so that a reconfiguration of the escape route marking, for example in the event of change of the cabin layout, is possible with manageable expenditure. It is solely to be ensured for the installation that the photoluminescent surfaces can be sufficiently charged by the cabin lighting in normal operation.

However, the latter is no longer always possible due to the LED technology increasingly being used for the cabin lighting. Although LED lights offer the operators a high level of variability for the lighting of an aircraft cabin with low power consumption, it is not ensured that, at least in the flight phases relevant in terms of safety aspects, sufficient light is provided in the spectral range relevant for the charging of the photoluminescent escape route marking.

SUMMARY

In an embodiment, the present disclosure provides an illumination element that marks escape routes in vehicles. The illumination element includes a planar substrate, which has: a base surface configured for fastening on a first side; and at least one planar electrical lighting element on a second side. A ratio of a surface area of the base surface to a thickness of the illumination element is greater than 500 mm, and a ratio of the surface area of the base surface to a mass of the illumination element is greater than 100 mm$^2$/g.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

In an embodiment, the present disclosure provides an illumination element for marking escape routes in vehicles, in particular in commercial aircraft, with which the disadvantages and problems from the prior art no longer occur or still occur only to a reduced extent.

The present disclosure relates to illumination element for marking escape routes in vehicles, comprising a planar substrate having a base surface provided for fastening on the first side and at least one planar electrical lighting element on the second side, wherein the ratio of the surface area of the base surface to the thickness of the illumination element is greater than 500 mm and the ratio of the surface area of the base surface to the mass of the illumination element is greater than 100 mm$^2$/g.

Furthermore, the present disclosure relates to the use of an illumination element according to the invention as an escape route marking on board a commercial aircraft, wherein the illumination element is fastened with the base surface of the substrate on a structure on board the commercial aircraft and is connected to the onboard electrical system of the commercial aircraft.

The present disclosure also relates to an arrangement for marking escape routes in a vehicle, comprising at least one illumination element according to the present disclosure, an energy supply infrastructure extending over the passenger area of a vehicle for the at least one illumination element, so that it is disposable at a variety of different positions in the passenger area and can be supplied with energy via the energy supply infrastructure, and a signal generator for generating and emitting control signals for the at least one illumination element.

First, several terms used in conjunction with the present disclosure will be explained.

An element is considered "planar" if the characteristic dimensions of a surface of the element are each greater by at least an order of magnitude (power of 10) than the characteristic dimension of the element perpendicular to the surface. In the case of a rectangular surface, the characteristic dimensions are, for example, the length and width, in the case of a circular surface the diameter. The dimension perpendicular to the surface in question is commonly also referred to as the "thickness" of the element.

The present inventors has recognized that by making use of certain technologies, illumination elements for marking the escape route in vehicles, in particular in commercial aircraft, may be provided, which are electrically operated and are thus independent of the incident light thereon, but may nonetheless be integrated easily and flexibly into the vehicle or its cabin. The present disclosure has provided in this case, independently of ultimate lighting elements or other technical specifications resulting therefrom, by way of the dimensioning specified according to the invention, for the first time a flexibly usable, electrically operated illumination element which has practically no constructive requirements for the structure accommodating the illumination element. As a result, for example, the change of the escape route marking generally accompanying a change of the cabin layout in a commercial aircraft is also possible without problems, although the illumination elements according to the present disclosure are electrically operated.

This is achieved, according to an aspect of the present disclosure, by the specification of the two ratios:

$$\frac{\text{Surface area}_{Base\ surface}\ [\text{mm}]}{\text{Thickness}_{Illumination\ element}\ [\text{mm}]} \geq 500\ \text{mm}$$

and $$\frac{\text{Surface area}_{Base\ surface}\ [\text{mm}]}{\text{Mass}_{Illumination\ element}\ [\text{g}]} \geq 100\ \frac{\text{mm}^2}{\text{g}}$$

Due to the interaction of surface area of the base surface of the substrate of the illumination element with the thickness and the mass of the illumination element, it is ensured that the illumination element—independently of the ultimately used technology for the lighting element and the attachment to the supporting structure, for which diverse variants are also listed hereunder, even in the event of extreme accelerations, as are defined, for example, for commercial aircraft for specific emergency situations at up to 9 g (nine times the acceleration of gravity (cf., for example 14 CFR § 25.561)—fundamentally do not represent a strain on the accommodating support structure for which it has to be especially designed. Rather, due to the planar, flat design, it is ensured that even at very high accelerations, only extremely minor forces and torques are introduced into the accommodating structure, which generally do not require special consideration and in particular do not require any structural adaptation of the support structure.

It is preferred if the ratio of the surface area of the base surface to the thickness of the illumination element is greater than 900 mm, preferably is greater than 2000 mm, and/or the ratio of the surface area of the base surface to the mass of the illumination element is greater than 150 mm$^2$/g, preferably is greater than 250 mm$^2$/g. The maximum strain on the support structure can be reduced further by corresponding boundary conditions which are achievable by suitable selection of available technologies.

The substrate can be rigid, wherein it is then preferably shaped so that a level, single-curved, or free-form base surface results. The shape of the substrate can be adapted here in particular to the shape of the surface of the support structure to which the illumination element is to be fastened. However, it is preferred if the substrate is flexible to thus be able to adapt itself in situ to the shape of a support structure. For example, the substrate can be a flexible plastic film.

The base surface provided for fastening can be self-adhesive at least in regions, preferably over the full surface. Due to the self-adhesive design, easy attachment of the illumination element according to the present disclosure is possible. It results here from the specifications according to the present disclosure for the above-described ratios that the base surface is generally large enough—at least insofar as it is self-adhesive over the full surface—even with typical properties of known adhesive coatings for mounting purposes, to be able to introduce all strains to be expected solely via the adhesive surface into the support structure, without the illumination element detaching from the support structure. A planar, often uniform strain introduction into the support structure is furthermore achieved.

Alternatively or additionally, it is possible that the illumination element has at least one passage area for fastening elements, such as nails, rivets, or screws. The passage area can be designed as an opening for feeding through a corresponding fastening element. However, it is preferred if the at least one passage area is fundamentally closed and is first opened before or when a fastening element is fed through. The illumination element—possibly in addition to an adhesive bond—can be fastened on a support structure at the passage area or areas.

The at least one lighting element can be an OLED, plasma, or electroluminescent element. If multiple lighting elements are provided in an illumination element, they can be connected in series or in parallel at least in groups. However, it is also possible to design the lighting elements so as to be at least partially individually activatable.

The lines required for connecting the at least one lighting element are preferably disposed on the second side of the substrate. Furthermore, the corresponding lines are preferably routed up to the edge of the second side of the substrate. Interfaces can be provided there for connecting the lighting element to a wired energy supply, for example the onboard electrical system of a commercial aircraft.

Furthermore, a chargeable energy accumulator, preferably comprising a charging circuit, a control circuit for controlling the at least one lighting element, an antenna for receiving control signals, and/or an antenna for wireless energy transfer can be provided on the substrate, preferably on the second side of the substrate.

The lighting element can be operated in an emergency even without an external energy supply by the chargeable energy accumulator—for example a chargeable battery or a (super) capacitor. The provision of a charging circuit and/or control circuit, in particular if the latter receives control signals via an antenna also disposed on the second side, simplifies the installation of the illumination element according to the present disclosure, since it then only has to be connected to an external energy supply. The provision of additional elements, such as emergency supply batteries having separate charging circuit, as in systems from the prior art, can thus be omitted.

Even a wired energy supply can be dispensed with if the illumination element has an antenna for wireless energy transfer. If the illumination element is provided for an installation in an area having suitable magnetic flux, an energy supply via cable can be completely dispensed with.

The control circuit can switch the at least one lighting element on or off in dependence on received control signals, which can be received via a suitable antenna or a wired data line, and/or if the external energy supply is lost. The control circuit can also be designed to emit a status communication to a higher-order controller. These items of information can be transmitted via the antenna and/or the data line, which is provided for receiving control signals.

It is preferred if the at least one lighting element, the energy accumulator, the charging circuit, the control circuit, the antenna(s), and/or the required lines are printed on the substrate, preferably on the second side of the substrate. Due to the low complexity of the individual elements potentially to be printed on and the printing area, which is generally sufficient in view of the prescribed size ratios of the illumination element or the substrate, the elements in question can be applied in layers using methods typical in industry, such as gravure printing, offset printing, flexographic printing, inkjet printing, or screen printing. If all elements to be printed are disposed on the second side of the substrate, this simplifies the production. In particular, no vias through the substrate are required.

Printed components offer the additional advantage over surface-mounted components that the former restrict any potential flexibility of the substrate only less severely or not at all. The printed lighting element can in particular include printed light-emitting diodes, which are generally homogeneously flexible.

It is preferred if a continuous protective coating, which is at least translucent at least in the areas of the lighting elements, is disposed on the second side of the substrate. The at least one lighting element, the energy accumulator, the charging circuit, the control circuit, the antenna(s), and/or the lines on the second side of the substrate can be protected by the protective coating from external influences, in particular from moisture. In that the protective coating is at least translucent at least in the areas in which the lighting elements are disposed, the light generated by the lighting elements can pass through the protective coating. However, the protective coating can also be transparent at least in the areas in question. The protective coating can be a lacquer layer or a coating made of plastic.

In particular if a large number of illumination elements are required for an identical use—for example for equipping the seat structure of individual seats or seats permanently connected to form rows of seats—it can be provided that a connecting line is integrally embodied with the illumination element. For this purpose, in particular the substrate of the illumination element can be expanded accordingly for the desired course of the connecting line, wherein electrical field lines can then be formed on this expansion similarly to the conductor tracks of the illumination element and/or the expansion can be provided with a protective coating, which is preferably integrally formed with the protective coating of the illumination element. In particular if the illumination element is produced in a printing method, a corresponding connecting line may also be formed integrally therewith without problems.

Reference is made to the above statements for the explanation of the use according to the present disclosure. The structure on which the illumination element is fastened can be, for example, floor or wall panels, or else parts of passenger seats.

Reference is also first made to the above statements for the explanation of the arrangement according to the present disclosure.

The energy supply infrastructure of the arrangement is designed so that one or more illumination elements can be alternately disposed at greatly varying positions in the passenger area of a vehicle, for example the passenger cabin of a commercial aircraft, and nonetheless can be supplied with energy easily via the energy supply infrastructure. Substantial flexibility in the redesign of vehicle interiors is enabled by a corresponding energy supply infrastructure, since the often mandatory escape route marking by illumination elements and the energy supply infrastructure can be disposed at greatly differing positions, which are almost arbitrary with suitable design of the energy supply infrastructure, and on practically arbitrary structures, such as wall or floor panels, but also on seat structures or other furniture structures. The energy supply infrastructure is preferably adapted to the illumination elements. If the illumination elements are designed for a wired energy supply, the energy supply infrastructure can comprise a plurality of connection options for a suitable supply line. If the energy is to be transferred wirelessly to the illumination elements, the energy supply infrastructure preferably comprises transmitting modules suitable for this purpose.

This applies in an analogous manner to the signal generator of the arrangement, which has two output control signals in a form suitable for the illumination elements. If a wired signal transmission is provided, for example in the form of pulses or the applied voltage, the signal generator is designed so that it can feed the corresponding pulses into the energy supply or can regulate the voltage of the energy supply accordingly. Alternatively or additionally, the signal generator can be designed to emit control signals via radio.

The signal generator can comprise a buffer battery, to still be able to emit control signals if the energy supply is lost.

Figure 1A:
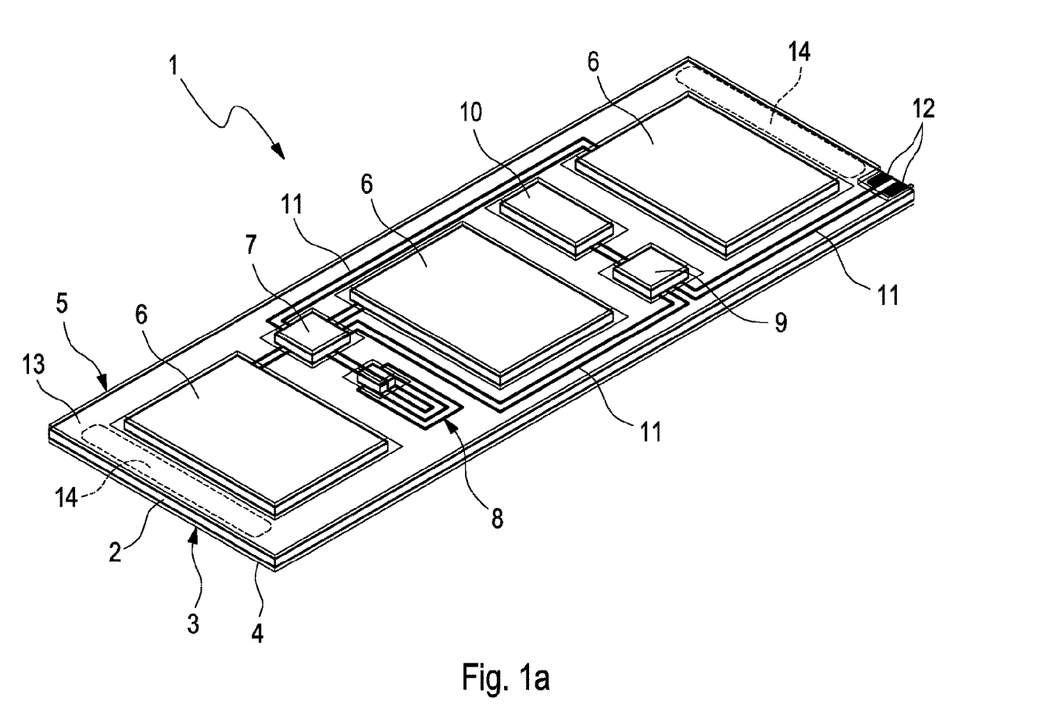
FIG. 1a and FIG. 1b show a schematic illustration of a first exemplary embodiment of an illumination element according to the present disclosure.
Figure 1B:
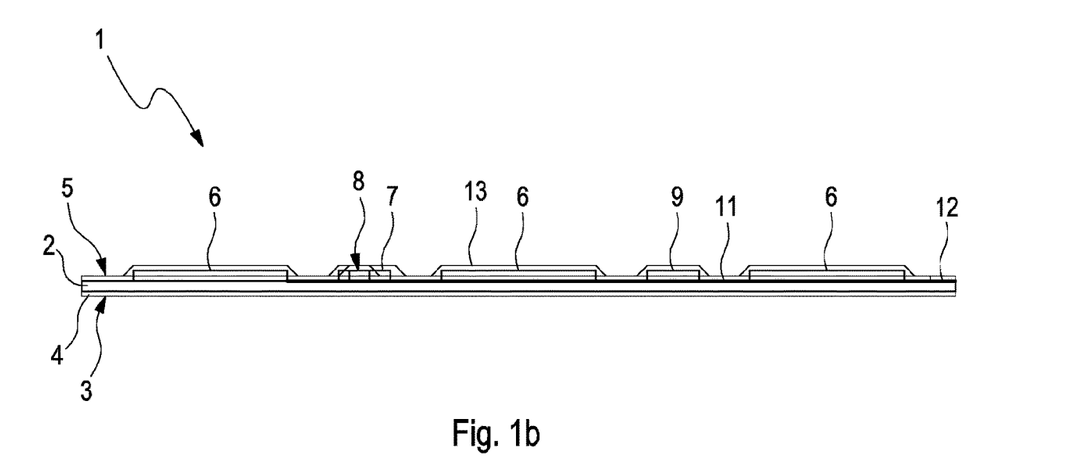

FIG. 1a shows a first exemplary embodiment of an illumination element 1 according to the present disclosure in an isometric illustration. FIG. 1b shows the illumination element 1 in a side view.

The illumination element 1 comprises a flexible plastic film as a planar substrate 2 having a base surface of 15×45 mm$^2$ at a thickness of 0.2 mm. An adhesive layer 4 is provided over the full surface on the first side 3 of the substrate 2, by way of which the illumination element 1 can be fastened on a suitable surface of a support structure. The base surface is self-adhesive due to the adhesive layer 4 having a thickness of 0.1 mm.

Various components 6-12, still to be explained hereinafter, are applied via inkjet printing methods on the second side 5 of the substrate 2. Due to the printing method and the low height of at most 0.2 mm of the individual components, the flexibility of the substrate 2 is only slightly impaired. The substrate 2 and as a result the illumination element 1 remain flexibly deformable, in order to thus be able to adapt themselves to any surface of a carrier structure.

Three lighting elements 6 are printed on the second side 5 of the substrate 2. The lighting elements 6 are printed OLEDs which are connected via conductor tracks 11, also printed, to a control circuit 7, which can individually control the energy supply to the lighting elements 6. The control circuit 7 is connected to a printed antenna 8, via which control signals can be received and status messages can be sent by the control circuit 7. The lighting elements 6 can be activated and deactivated as desired via corresponding control signals. A control signal can also be provided for a status query, upon which the control circuit 7 emits the current operating state of the illumination unit 1 via the antenna 8.

The energy required for operating the control circuit 6 and the lighting elements 6 is applied to the control circuit 6 via printed lines 11 from the charging circuit 9. The charging circuit 9 is connected to a chargeable energy accumulator 10 and may furthermore be connected via conductor tracks 11, which are led to the edge of the substrate 2 and expanded there to form contact surfaces 12, to an external energy source, for example to the onboard electrical system. The charging circuit 9 is designed to completely charge the energy accumulator 10 in normal operation and to supply the control circuit 1 with externally supplied energy. The control circuit 7 and, via this, the lighting elements 6 are first supplied with energy from the energy accumulator 10 when the external energy source is lost. The energy supply by the energy accumulator 10 takes place here at somewhat lower voltage than the energy supply from the external energy source. The control circuit 6 can be designed for voltage detection and to activate the lighting elements 6 automatically when a lower voltage is established—which can be equated to the failure of the external energy source.

The second side 5 of the substrate is continuously coated—with the exception of the area around the context surfaces 12—with a transparent lacquer as a protective coating 13. The thickness of the protective coating 13 is 0.1 mm, wherein the lacquer is selected so that the fundamental flexibility of the substrate 2 is not restricted and the lacquer does not break even upon bending of the substrate 2.

In the edge areas of the substrate 2, in which no components 6-12 are disposed, passage areas 4 are provided for fastening elements. If the adhesive layer 4 is not sufficient for fastening the illumination element 1 (for example, because the corresponding surface of the support structure has poor adhesive properties), the illumination element 1 can be penetrated in the passage areas 4, in order to thus also be fastened on the support structure using nails, rivets, or screws, in addition to the adhesive layer 4.

From the above-mentioned thicknesses of the individual layers of the illumination element (adhesive layer 4=0.1 mm, substrate 2=0.2 mm, components 6-12<0.2 mm, and protective layer=0.1 mm) a total thickness of not more than 0.6 mm results. In view of the size of the base surface of the substrate 2 of 15×45 mm² for the illumination element 1 shown in FIG. 1, a ratio results of this substrate base surface to a thickness of the illumination element 1 of:

$$\frac{15 \times 45 \text{ mm}^2}{0.6 \text{ mm}} = 1.125 \text{ mm}$$

The total mass of the individual layers 2, 4, 13 and the components 6-12 is 6.5 g in the illustrated exemplary embodiment, so that the following results for the ratio of substrate base surface to the mass of the illumination element 1:

$$\frac{15 \times 45 \text{ mm}^2}{6.5 \text{ g}} = 103.84 \frac{\text{mm}^2}{\text{g}}$$

The weight of 6.5 g can be achieved by selection of light construction materials, but possibly also by adapting the size of the individual components 6-12, such as the lighting elements 6 and the energy accumulator 10, wherein a sufficient luminosity and energy supply for the emergency has to remain ensured, of course.

Figure 2:
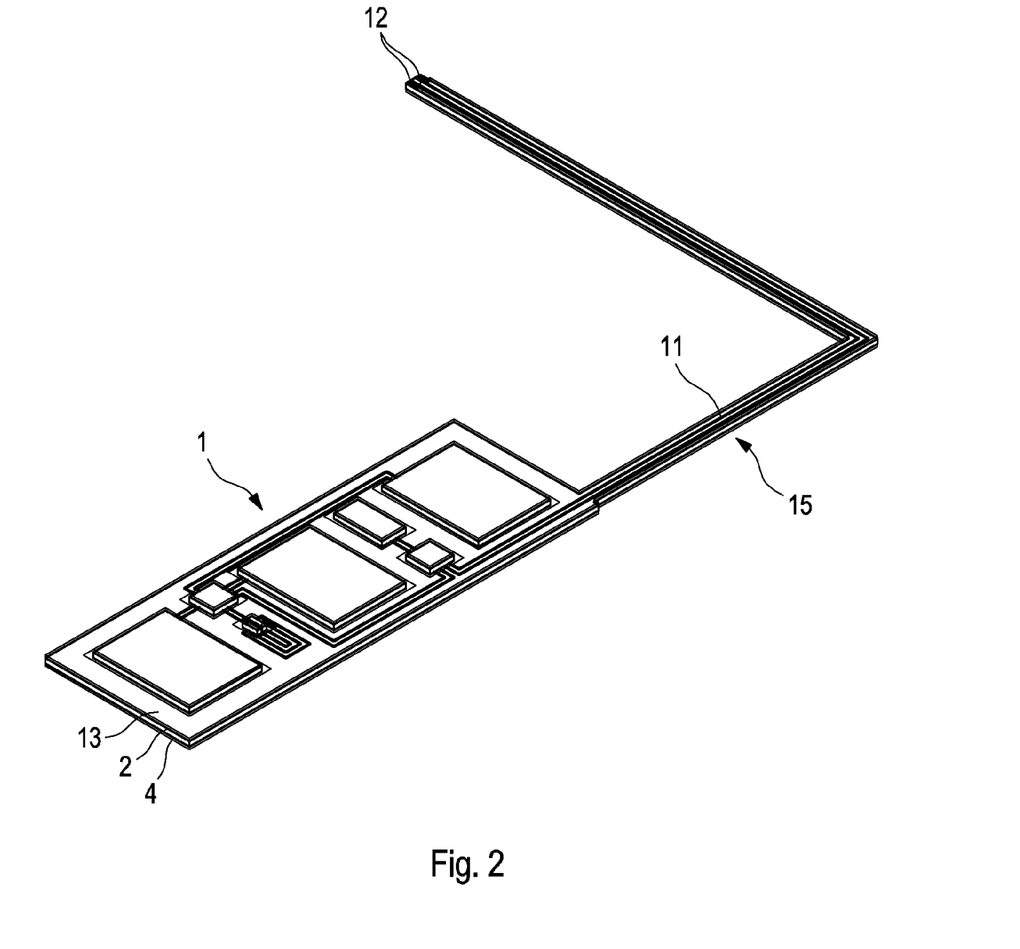
FIG. 2 shows a schematic illustration of a second exemplary embodiment of an illumination element according to the present disclosure.

A second exemplary embodiment of an illumination element 1 according to the present disclosure is shown in FIG. 2. The actual illumination element 1 corresponds here in its entirety to that from FIG. 1, because of which reference is made to the above explanations.

A connection line 15, which is integrally embodied with the illumination element 1, is additionally provided on the illumination element 1 according to FIG. 2. For this purpose, the substrate 2 extends in the desired form of the connection line 15 beyond the actual illumination element 1. The conductor tracks 11 are continued on the substrate 2 in the area of the connection line 15 and discharge into the contact surface 12 at the end of the connection line 15. Both the adhesive layer 4 and the protective layer 13 also extend integrally over the connection line 15.

Figure 3:
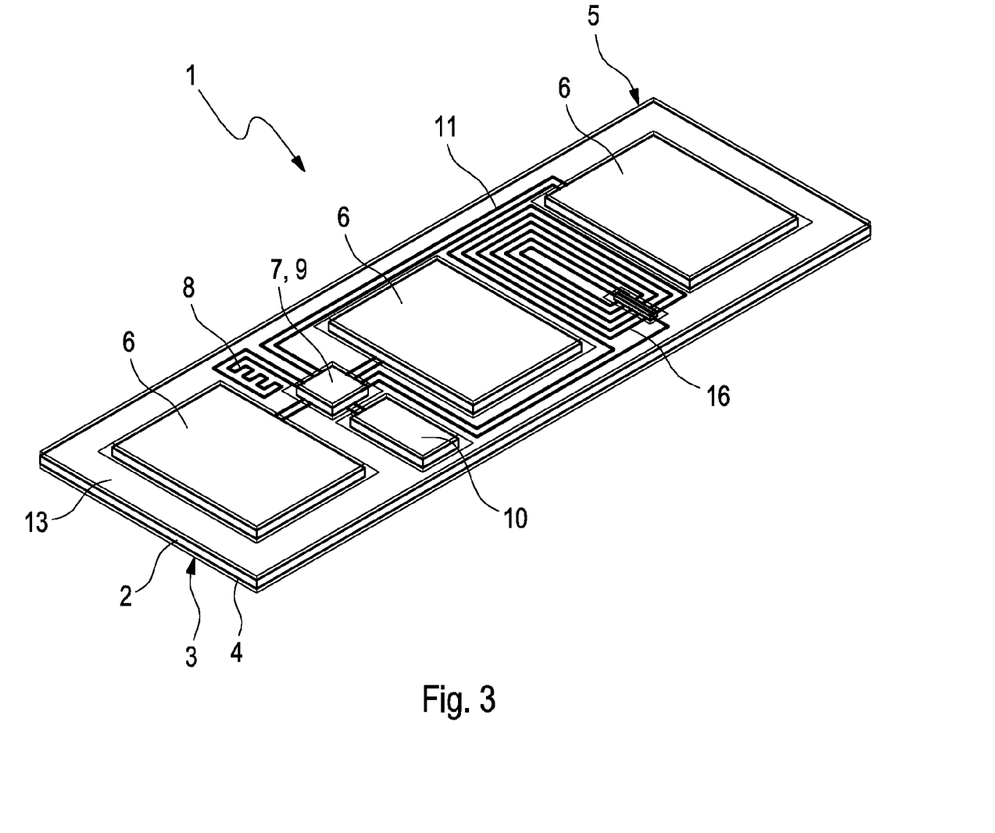
FIG. 3 shows a schematic illustration of a third exemplary embodiment of an illumination element according to the present disclosure.

FIG. 3 shows a third exemplary embodiment of an illumination element 1 according to the present disclosure, which again is identical in large parts to that from FIG. 1, because of which reference is first made to the explanations there for explanation.

In the illumination element 1 according to FIG. 3, the control circuit 7 and the charging circuit 9 are integrated into a single circuit 7, 9. In addition, the antenna 8 and the energy accumulator 10 are also disposed differently to provide space for an antenna 16 for wireless energy transmission. The antenna 16 is designed here so as to be inductively coupled with a suitable coil, so that electrical energy can be transmitted wirelessly to the illumination element 1 and can be used there, as described above, to operate the control circuit 7 and the lighting elements 6, but also to charge the energy accumulator 10.

It is also possible to combine the two antennas 8, 16 with one another and design them as a single antenna.

Figure 4:
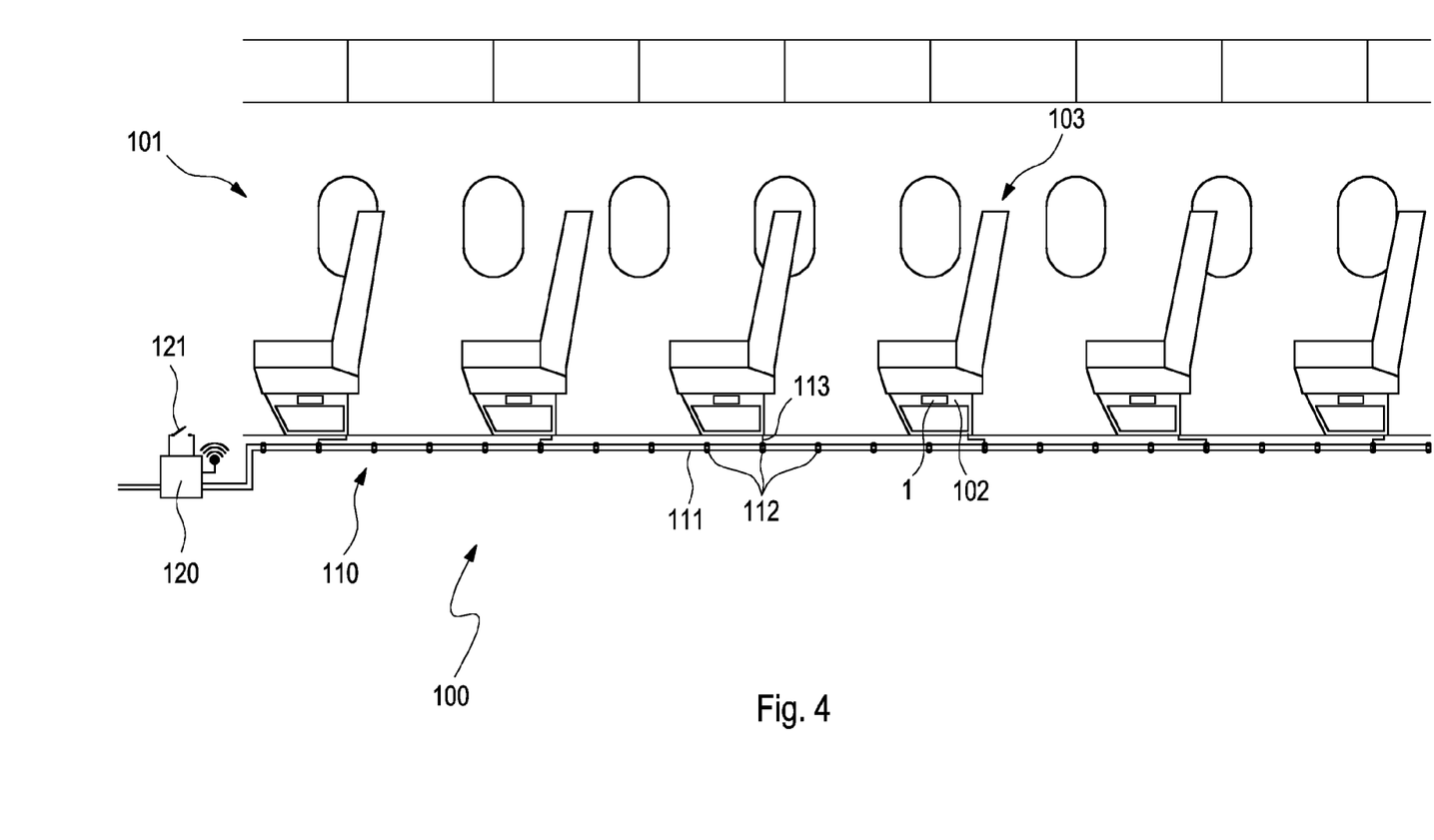
FIG. 4 shows a schematic illustration of a first exemplary embodiment of an arrangement according to the present disclosure.

FIG. 4 shows a first exemplary embodiment of an arrangement 100 according to the present disclosure in a schematic illustration. The arrangement 100 is located here in the passenger cabin, thus the passenger area 101 of a commercial aircraft, and comprises a large number of illumination elements 1 according to the present disclosure, as are shown, for example, in FIGS. 1 and 2. The illumination elements 1 are adhesively bonded to the seat structure 102 of the rows of seats 103 disposed in the passenger area 101, wherein the seat structure 102 is not specially designed to accommodate the illumination elements 1. The rows of seats 103 can in particular be old stock, which was not previously provided with illumination elements 1.

An energy supply infrastructure 110 is provided along the floor of the passenger area 101, which in this exemplary embodiment comprises a line strand 111 extending along the passenger area 101, on which connection possibilities 112 for the supply lines 113 to illumination elements 1 are provided at regular intervals. The intervals between the individual connection possibilities 112 are selected sufficiently small here that, independently of the actual position of individual rows of seats 103 in the passenger area 101, a connection possibility 112 is always located in the vicinity for the illumination element 1 disposed on the row of seats 103.

The signal generator 120 of the arrangement is connected to the energy supply infrastructure 110 and generates, in dependence on the voltage applied there and/or the position of the switch 121, control signals which are emitted via radio so that they can be received by the illumination units 1. In order to still be able to emit control signals even if the energy supply via the energy supply infrastructure 110 is lost, the signal generator 120 has an integrated buffer battery.

The switch 121 can be an automatic switch for detecting an emergency or an electronic switch which is actuated by other systems of the vehicle.

Figure 5:
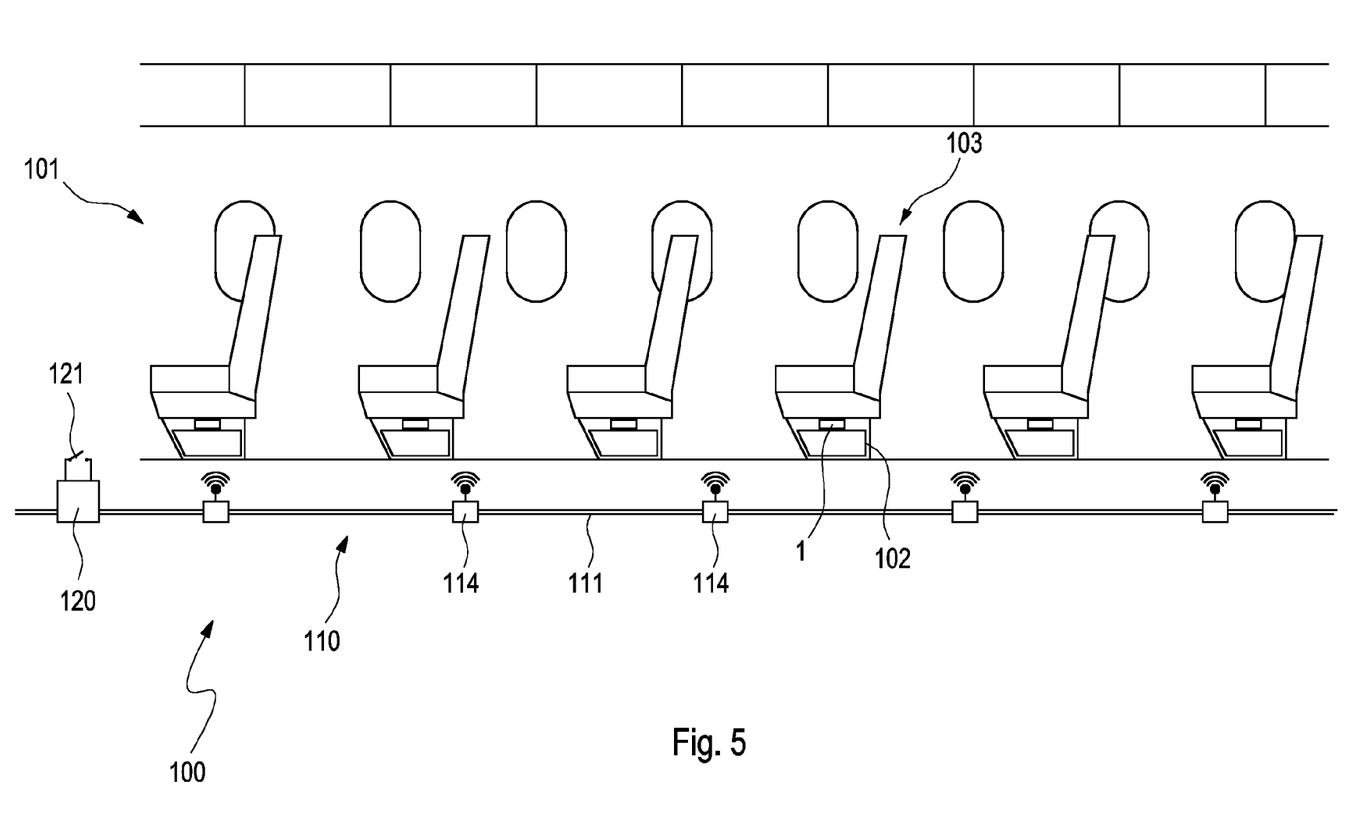
FIG. 5 shows a schematic illustration of a second exemplary embodiment of an arrangement according to the present disclosure.

A second exemplary embodiment of an arrangement according to the present disclosure is shown in FIG. 5.

In this exemplary embodiment, the illumination elements 1 are disposed similarly to the arrangement according to FIG. 4, but are designed according to FIG. 3, thus comprise an antenna 16 for wireless energy transmission.

Transmitting modules 114 are provided along the passenger cabin 101 as part of the energy supply infrastructure 110, which not only wirelessly transmit energy in dependence on the voltage in the line strand 111, but also emit control signals, which can be processed by the illumination elements 1. The energy transmission takes place at close range here, wherein the transmitting modules 114 are disposed so that the rows of seats 103 having the illumination elements 1 disposed on the seat structure 102 are disposed at arbitrary positions within the passenger area 101 and the corresponding illumination elements 1 can nonetheless be supplied with energy by the transmitting modules 114.

The signal generator 120 of the arrangement is disposed in the supply line of the energy supply infrastructure 110 and can systematically control the voltage in the energy supply infrastructure 110. In dependence on the voltage applied at the signal generator 120 and/or the position of the switch 121, the voltage in the line strand 111 can be set so that the transmitting modules 114 emit sufficient energy to the illumination element 1 and/or the desire control signals, in order to thus be able to switch the lighting elements 6 of the illumination elements 1 on and off.

The signal generator 120 also has an integrated buffer battery here, in order to still be able to emit control signals via the energy supply infrastructure 110 even if the energy supply is lost.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An illumination element for marking escape routes in vehicles, the illumination element comprising:
   a planar substrate comprising:
      a base surface configured for fastening on a first side; and
      at least one planar electrical lighting element on a second side,
      wherein a chargeable energy accumulator, a control circuit configured to control the at least one lighting element, an antenna configured to receive control signals, and an antenna configured to wirelessly transmit energy are provided on the substrate, and
   wherein a ratio of a surface area of the base surface to a thickness of the illumination element is greater than 500 mm, and a ratio of the surface area of the base surface to a mass of the illumination element is greater than 100 mm$^2$/g.

2. The illumination element as claimed in claim 1, wherein the ratio of the surface area of the base surface to the thickness of the illumination element is greater than 900 mm, or the ratio of the surface area of the base surface to the mass of the illumination element is greater than 150 mm$^2$/g.

3. The illumination element as claimed in claim 1, wherein the substrate is rigid, or
wherein the base surface is level, single-curved, or a free-form surface, or
wherein the substrate is flexible.

4. The illumination element as claimed in claim 1, wherein the base surface is self-adhesive at least in regions.

5. The illumination element as claimed in claim 1, wherein the illumination element comprises at least one passage area for fastening elements.

6. The illumination element as claimed in claim 1, wherein the at least one lighting element is an organic light emitting diode (OLED), plasma, or electroluminescence element.

7. The illumination element as claimed in claim 1, wherein the at least one lighting element, the energy accumulator, the charging circuit, the control circuit, and the antenna configured to receive control signals or the antenna configured to wireless transmit energy are printed on the substrate.

8. The illumination element as claimed in claim 1, wherein a continuous protective coating, which is at least translucent at least in areas of the lighting elements, is provided on the second side of the substrate.

9. The illumination element as claimed in claim 1, wherein a connection line is embodied integrally with the illumination element.

10. A commercial aircraft comprising the illumination element as claimed in claim 1, wherein the illumination element is fastened using the base surface of the substrate on a structure on board the commercial aircraft and is connected to an onboard electrical system of the commercial aircraft.

11. An arrangement for marking escape routes in a vehicle, comprising the illumination element as claimed in claim 1, an energy supply infrastructure for the illumination element extending over a passenger area of the vehicle, so that it is disposable at a large number of different positions in the passenger area and is configured to be supplied with energy via the energy supply infrastructure, and a signal generator configured to generate and emit control signals for the illumination element.

12. The arrangement as claimed in claim 11,
wherein the energy supply infrastructure comprises transmitting modules configured to wirelessly transmit energy.

13. The illumination element as claimed in claim 1,
wherein the ratio of the surface area of the base surface to the thickness of the illumination element is greater than 2000 mm, and the ratio of the surface area of the base surface to the mass of the illumination element is greater than 250 mm$^2$/g.

14. The illumination element as claimed in claim 1, wherein the antenna configured to receive control signals and the antenna configured to wireless transmit energy are separate antennas.

15. The illumination element as claimed in claim 1, wherein the antenna configured to receive control signals and the antenna configured to wireless transmit energy are combined with one another as a single antenna.

* * * * *